United States Patent
Liang

(10) Patent No.: US 7,528,664 B1
(45) Date of Patent: May 5, 2009

(54) METHOD OF AND APPARATUS FOR IMPROVING THE SIGNAL-TO-NOISE RATIO FOR A DIGITAL CONVERSION CIRCUIT

(75) Inventor: Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/002,733

(22) Filed: Dec. 17, 2007

(51) Int. Cl.
*H03L 7/06* (2006.01)

(52) U.S. Cl. ............... 331/1 A; 327/159; 327/160; 331/1 R; 341/157; 375/376

(58) Field of Classification Search ........... 341/157; 327/156, 159, 160; 331/1 A, 1 R, 10–12, 331/25; 375/373, 374, 375, 376
See application file for complete search history.

(56) References Cited

U.S. PATENT DOCUMENTS

| | | | | |
|---|---|---|---|---|
| 3,883,817 A | * | 5/1975 | Cliff | ................ 331/1 A |
| 4,595,992 A | * | 6/1986 | Drogin | .................. 702/79 |
| 4,918,709 A | * | 4/1990 | Fitch | .................. 375/373 |
| 4,970,472 A | * | 11/1990 | Kennedy et al. | ........... 331/25 |
| 2004/0146131 A1 | * | 7/2004 | Wilson | .............. 375/375 |
| 2008/0246525 A1 | * | 10/2008 | Bazes | .................. 327/178 |

\* cited by examiner

*Primary Examiner*—Howard Williams

(57) ABSTRACT

The signal-to-noise ratio for a digital conversion circuit is improved by taking a source signal and generating N signals that are each phase-shifted relative to each other, thereby generating N phase-shifted signals. Each of the N signals has a frequency that is a fraction of a frequency of the source signal. The source signal is input to a dividing circuit to generate the N signals. The source signal is generated by a signal source, such as an oscillator. Each of the N signals is hard-limited and processed through a detection circuit. The detection circuit can be a frequency detection circuit configured to determine the frequency of the source signal and to output a corresponding digital word, or a phase detection circuit configured to determine a phase of the source signal and to output a corresponding digital word.

43 Claims, 10 Drawing Sheets

METHOD OF AND APPARATUS FOR IMPROVING THE SIGNAL-TO-NOISE RATIO FOR A DIGITAL CONVERSION CIRCUIT

FIELD OF THE INVENTION

The present invention relates to digital conversion. More particularly, the present invention relates to improving the signal-to-noise ratio for a digital conversion circuit including a frequency-to-digital converter or a phase-to-digital converter.

BACKGROUND OF THE INVENTION

In general, the signal-to-noise ratio (SNR) is a measure of signal strength relative to background noise. As applied to a frequency-to-digital converter (FDC), the SNR relates to the amount of noise introduced during the digital conversion process. Maximizing the SNR is a desired design consideration.

A conventional FDC receives a hard-limited sine-wave input signal, counts the edge transitions in the signal for a given period of time, and compares the result with a reference clock signal to obtain the frequency of the input signal. The input signal frequency is then converted to a corresponding digital number. Typically, the FDC determines the input signal frequency using the relationship between the ratio of the input signal frequency to the reference clock frequency, and the ratio of the number of rising and falling edges of the input signal to the number of rising and falling edges of the reference clock signal. Since the reference clock frequency and the number of rising and falling edges of the reference clock signal are known, and the number of rising and falling edges of the input signal are counted by the FDC, the input signal frequency is calculated using the above relationship. The phase change between each rising edge is 360 degrees, and the phase change between each successive rising edge and falling edge is 180 degrees. As such, this procedure can only differentiate the signal with 180 degrees phase change.

A digital conversion circuit includes a FDC. In many applications, the digital conversion circuit is configured as a phase-locked loop (PLL) or a frequency-locked loop (FLL).

FIG. 1 illustrates an exemplary digital conversion circuit configured as a FLL. The digital conversion circuit 2 includes a frequency detector 4, a loop filter 6, and a voltage controlled oscillator (VCO) 8 coupled as a frequency-locked loop. The frequency detector 4 includes a frequency-to-digital comparator (not shown). The VCO 8 includes an oscillator 12 and a dividing circuit 14, which in this exemplary configuration is a divide by 2 circuit. The oscillator 12 provides a source signal to the divide by 2 circuit 14. The divide by 2 circuit 14 divides down the frequency of the received source signal and outputs two divided down signals, a first signal and a second signal. The first signal and the second signal have a frequency that is one-half that of the frequency of the source signal. The first signal and the second signal have the same waveform, but the second signal is phase-shifted by 90 degrees relative to the first signal.

The divide by 2 circuit 14 is coupled to the frequency detector 4 such that the first signal is provided as feedback to lock the FLL. The first signal is used as an input signal by the frequency detector 4, which in turn converts the first signal to a corresponding digital word. The digital word is provided as input to the oscillator 12 via the loop filter 6.

A typical oscillator generates a source signal with a frequency in a range about 4 GHz. In a high band application, a single divide by 2 circuit is used to divide down the source signal to form the first signal and the second signal, each with a frequency of about 2 GHz. In a high band application, the first signal with the divided down frequency is output from the digital conversion circuit 2. In a low band application, an additional divide by 2 circuit is used to further divide down the first signal to form two additional signals, each with a frequency of about 1 GHz. In either application, using only a single divided down signal as feedback to the frequency detector 4 results in a decreased SNR. In the high band application, the SNR of the output signal decreases by about 6 dB. In the low band application, the SNR of the output signal decreases by about 12 dB.

SUMMARY OF THE INVENTION

The SNR for a digital conversion circuit is improved by taking a source signal and generating N signals reduced in frequency from the source signal, each of the N signals are phase-shifted relative to each other, thereby generating N phase-shifted signals. A first signal of the N signals is in-phase with the source signal. The source signal is input to a dividing circuit to generate the N signals. The source signal is generated by a signal source, such as an oscillator. In an application where N=2, the dividing circuit is a divide by 2 circuit, which outputs a first signal and a second signal. The first signal and the second signal each have a frequency that is one-half the frequency of the source signal. In other words, the source signal frequency is divided down to the first and second signal frequency. The second signal is offset from the first signal by 90 degrees. If the source signal is represented as a sine-wave, then the first signal is also a sine-wave, but with a frequency one-half that of the source signal. In this case, the second signal is represented as a corresponding cosine-wave. Both the first signal and the second signal are hard-limited and processed through a detection circuit. With the input of the hard-limited first signal and the hard-limited second signal, the detection circuit differentiates a signal with 90 degrees phase change. In some embodiments, the detection circuit is a frequency detection circuit configured to determine the frequency of the first and second signals and to output a corresponding digital word. In other embodiments, the detection circuit is a phase detection circuit configured to determine a time difference of the first and second signals relative to a reference signal and to output a corresponding digital word.

In one aspect, an apparatus includes a dividing circuit configured to receive a source signal and to output N signals phase-shifted relative to each other, wherein a frequency of each of the N signals is a fraction of a frequency of the source signal, a plurality of hard-limiting circuits coupled to the dividing circuit, each hard-limiting circuit configured to receive one of the N signals output from the dividing circuit and to output a corresponding hard-limited signal, and a detection circuit coupled to the plurality of hard-limiting circuits, the detection circuit configured to receive each of the hard-limited signals and to output a digital word according the hard-limited signals. The dividing circuit can be a divide by N circuit. Each signal output from the dividing circuit can have a same signal waveform. The detection circuit can be a frequency detection circuit. In this case, the frequency detection circuit can be configured to output the digital word according to a number of rising and falling edges for all of the hard-limited signals. Alternatively, the detection circuit can be a phase detection circuit. In this case, the phase detection circuit can be configured to output the digital word according to a time difference between rising edges of successive hard-limited signals, or the phase detection circuit can be configured to output the digital word according to a time difference between falling edges of successive hard-limited signals. In some embodiments, each signal comprises a sine-wave, and each hard-limited signal comprises a hard-limited sine-wave. Each of the plurality of hard-limiting circuits can be a buffer amplifier.

In another aspect, a method of processing a signal includes receiving a source signal, dividing the source signal to generate N signals phase-shifted relative to each other, wherein a frequency of each of the N signals is a fraction of a frequency of the source signal, hard-limiting the N signals to generate N hard-limited signals, and converting the source signal to a corresponding digital word according to the N signals. The method can also include generating the source signal. Converting the source signal can include measuring a number of rising and falling edges for all of the N hard-limited signals. Alternatively, converting the source signal can include measuring a time difference between either rising edges of successive hard-limited signals or falling edges of successive hard-limited signals. Each of the N signals can have a same signal waveform. Each of the N signals can be a sine-wave, in which case each of the N hard-limited signals is a hard-limited sine-wave.

In yet another aspect, an apparatus includes a signal source configured to generate a source signal, a dividing circuit coupled to the signal source, wherein the dividing circuit is configured to receive the source signal and to output N signals phase-shifted relative to each other, further wherein a frequency of each of the N signals is a fraction of a frequency of the source signal, a plurality of hard-limiting circuits coupled to the dividing circuit, each hard-limiting circuit configured to receive one of the N signals output from the dividing circuit and to output a corresponding hard-limited signal, and a detection circuit coupled to the plurality of hard-limiting circuits, the detection circuit configured to receive each of the hard-limited signals and to output a digital word according to the hard-limited signals, wherein an output of the detection circuit is coupled to an input of the signal source, wherein the signal source is configured to generate the source signal according to the digital word received from the detection circuit, thereby forming a locked loop. One of the N signals can be in-phase with the source signal, and the apparatus can be configured to output the one in-phase signal as a divided down output signal. The dividing circuit can be configured to determine the fraction. The signal source can be an oscillator. The dividing circuit can be a divide by N circuit. Each signal output from the dividing circuit can have a same signal waveform. The detection circuit can be a frequency detection circuit. In this case, the frequency detection circuit can be configured to output the digital word according to a number of rising and falling edges for all of the hard-limited signals. Alternatively, the detection circuit can be a phase detection circuit. In this case, the phase detection circuit can be configured to output the digital word according to a time difference between rising edges of successive hard-limited signals, or the phase detection circuit can be configured to output the digital word according to a time difference between falling edges of successive hard-limited signals. Each signal can be a sine-wave and each hard-limited signal comprises a hard-limited sine-wave. Each of the plurality of hard-limiting circuits can be a buffer amplifier.

In another aspect, an apparatus includes a signal source configured to generate a source signal, a dividing circuit coupled to the signal source, wherein the dividing circuit is configured to receive the source signal and to output at least one divided down signal with a frequency that is a fraction of a frequency of the source signal, a hard-limiting circuit coupled to the signal source, wherein the hard-limiting circuit is configured to receive the source signal and to output a corresponding hard-limited signal, and a detection circuit coupled to the hard-limiting circuit, wherein the detection circuit is configured to receive the hard-limited signal and to output a digital word according to the hard-limited signal, wherein an output of the detection circuit is coupled to an input of the signal source, wherein the signal source is configured to generate the source signal according to the digital word received from the detection circuit, thereby forming a locked loop. One of the signals output from the dividing circuit can be in-phase with the source signal, and the apparatus can be configured to output the one in-phase signal as a divided down output signal. The dividing circuit can be configured to determine the fraction. The signal source can be an oscillator. The dividing circuit can be a divide by N circuit. Each signal output from the dividing circuit can have a same signal waveform. The detection circuit can be a frequency detection circuit. In this case, the frequency detection circuit can be configured to output the digital word according to a number of rising and falling edges for all of the hard-limited signals. Alternatively, the detection circuit can be a phase detection circuit. In this case, the phase detection circuit can be configured to output the digital word according to a time difference between rising edges of successive hard-limited signals, or the phase detection circuit can be configured to output the digital word according to a time difference between falling edges of successive hard-limited signals. Each hard-limited signal comprises a hard-limited sine-wave. Each of the plurality of hard-limiting circuits can be a buffer amplifier.

BRIEF DESCRIPTION OF THE SEVERAL VIEWS OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION

Embodiments of the present invention are directed to an improved digital conversion circuit. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the improved digital conversion circuit include a signal source, a dividing circuit, buffering amplifiers, and a detection circuit. In some embodiments, the signal source is an oscillator. The SNR of the digital conversion circuit is improved by dividing a source signal to form N complimentary signals, equivalent to each other in form, but phase-shifted relative to each other. Each of these N signals are provided to the detection circuit for conversion to a digital word that corresponds to the original source signal. Each of the N signals has a frequency that is divided down relative to the source signal frequency. In some embodiments, the digital conversion circuit is configured as a closed loop where all of the information included in the source signal is provided as feedback. All of the information is provided as feedback either by providing the source signal itself as feedback, or by providing each of the divided down N signals as feedback. The N signals output from the dividing circuit cumulatively include all of the information included in the source signal.

For simplicity, many of the following configurations, for example, FIGS. 2-7 and 10-12, are directed to exemplary system configurations where N=2, such that the dividing circuit is a divide by 2 circuit. It is understood that each of these configurations can be extended to the general configuration, such as the configuration in FIG. 13, where N is 1 or greater, such that the dividing circuit is a divide by N circuit.

Figure 1:
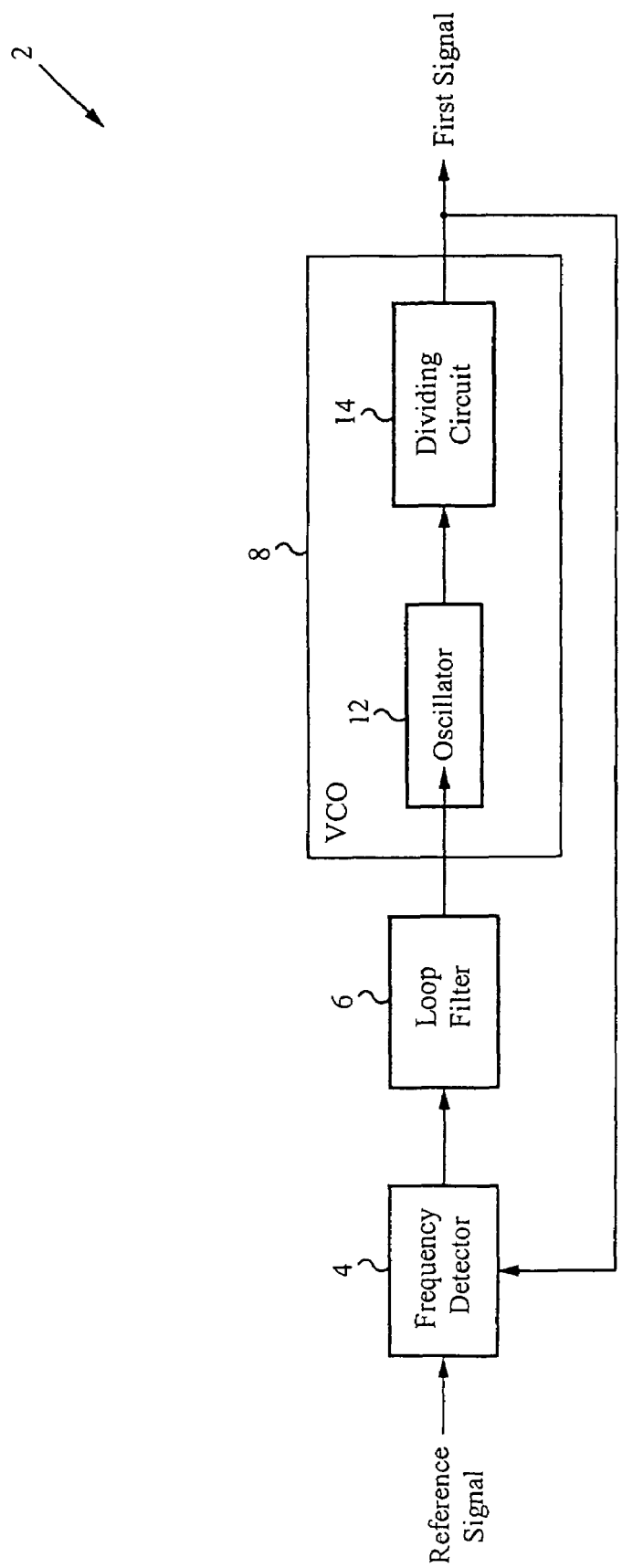
FIG. 1 illustrates an exemplary digital conversion circuit.
Figure 2:
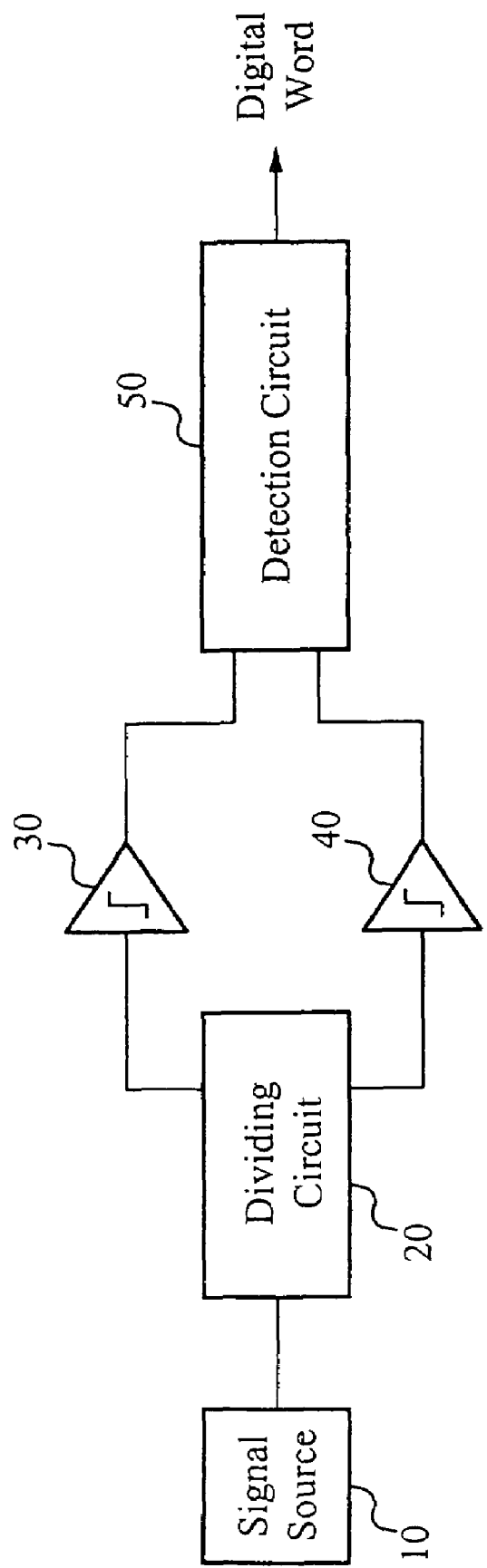
FIG. 2 illustrates an exemplary digital conversion circuit for providing digital conversion of a signal.

FIG. 2 illustrates an exemplary digital conversion circuit for providing digital conversion of a signal. The digital conversion circuit is configured as an open-loop and includes a signal source 10, a dividing circuit 20, a hard-limiting circuit 30, a hard-limiting circuit 40, and a detection circuit 50. In some embodiments, the signal source 10 is an oscillator. In this exemplary configuration, the dividing circuit 20 is a divide by 2 circuit. The signal source 10 provides a source signal to the dividing circuit 20. The dividing circuit 20 outputs a first signal and a second signal. The first signal and the second signal have a frequency that is one-half the frequency of the source signal. In other words, the source signal is divided down to the first signal and to the second signal. The second signal has the same waveform as the first waveform, but the second signal is phase-shifted relative to the first signal. In some embodiments, the first signal has a sine-waveform and the second signal has a cosine-waveform. In this case, the second signal is 90 degrees phase-shifted relative to the first signal.

The first signal is input to the hard-limiting circuit 30 and the second signal is input to the hard-limiting circuit 40. In some embodiments, both of the hard-limiting circuits 30 and 40 are buffer amplifiers. The hard-limiting circuit 30 outputs a hard-limited first signal, and the hard-limiting circuit 40 outputs a hard-limited second signal, each of which are input to the detection circuit 50.

In some embodiments, the detection circuit is a frequency detection circuit. In other embodiments, the detection circuit is a phase detection circuit.

Figure 8:
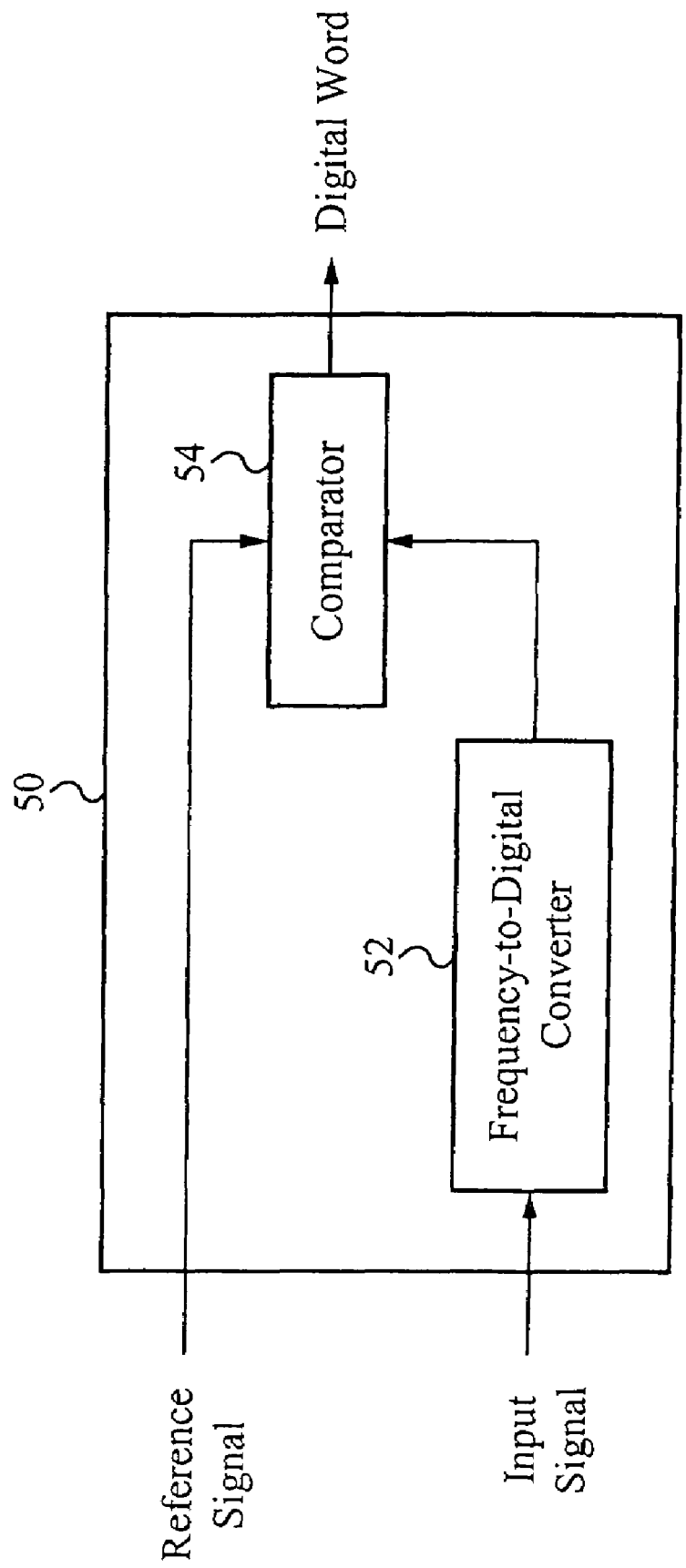
FIG. 8 illustrates an exemplary block diagram of the detection circuit configured as a frequency detection circuit.

FIG. 8 illustrates an exemplary block diagram of the detection circuit 50 configured as a frequency detection circuit. The frequency detection circuit 50 includes a frequency-to-digital converter (FDC) 52 and a comparator 54. The FDC 52 receives as input the hard-limited first signal output from the hard-limiting circuit 30 and the hard-limited second signal output from the hard-limited circuit 40, collectively referred to as the input signal in FIG. 8. The FDC 52 measures the number of rising and falling edges for the hard-limited first signal, and the number of rising and falling edges for the hard-limited second signal. These two numbers are added together to determine a cumulative number of falling and rising edges for both the hard-limited first signal and the hard-limited second signal. A reference signal is input to the comparator 54. The reference signal includes a reference frequency and a corresponding reference number of rising and falling edges. The comparator 54 determines a frequency of the input signal according to the cumulative number of rising and falling edges output from the FDC 52 and the input reference signal. A digital word corresponding to this determined frequency is generated and output by the comparator 54. The digital word output by the detection circuit 50 corresponds to the source signal provided to the dividing circuit 20.

Figure 9:
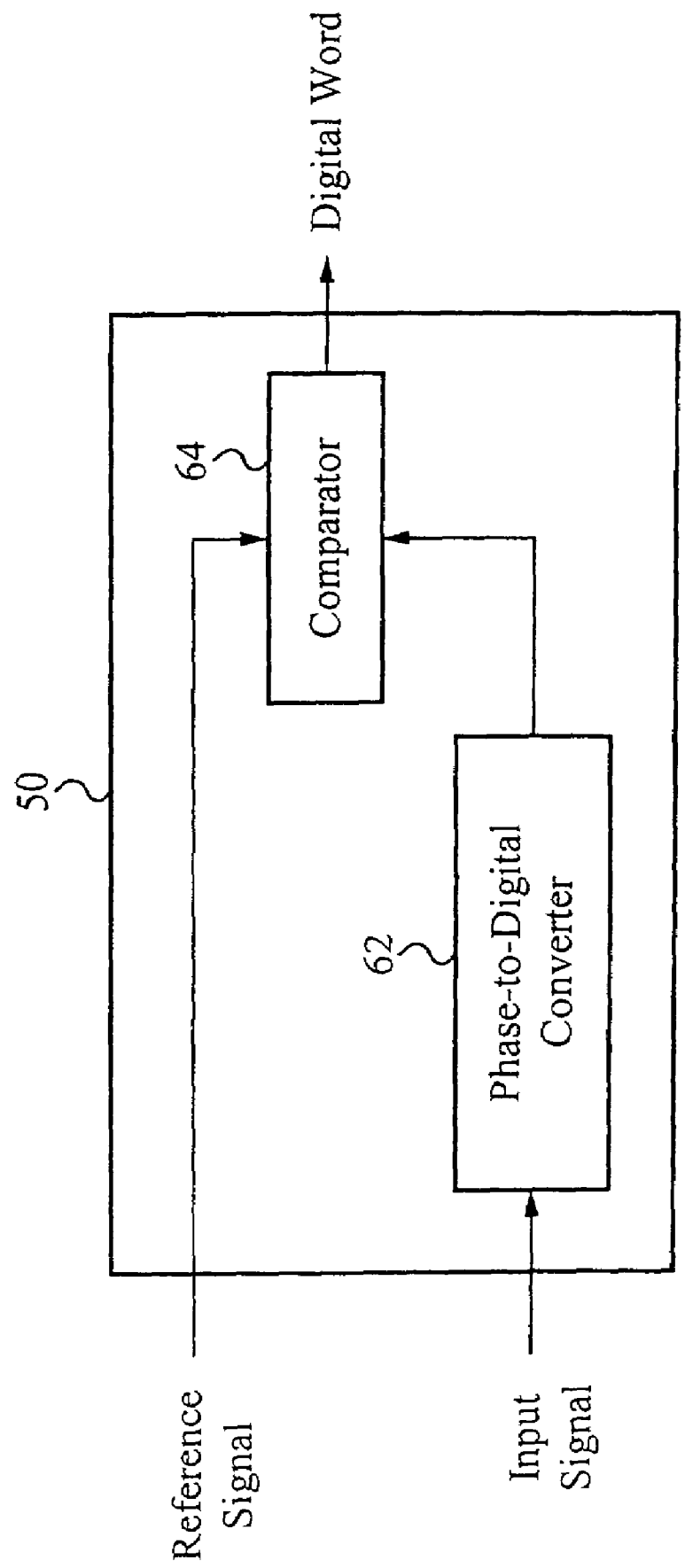
FIG. 9 illustrates an exemplary block diagram of the detection circuit configured as a phase detection circuit.

FIG. 9 illustrates an exemplary block diagram of the detection circuit 50 configured as a phase detection circuit. The phase detection circuit 50 includes a phase-to-digital converter (PDC) 62 and a comparator 64. The PDC 62 receives as input the hard-limited first signal output from the hard-limiting circuit 30 and the hard-limited second signal output from the hard-limited circuit 40, collectively referred to as the input signal in FIG. 9. The PDC 62 measures a time difference between the rising edge of the hard-limited first signal and the rising edge of the hard-limited second signal. Alternatively, the PDC 62 measures a time difference between the falling edge of the hard-limited first signal and the falling edge of the hard-limited second signal. A reference signal is input to the comparator 64. The reference signal includes a reference phase and a corresponding reference time difference. The comparator 64 determines a phase of the input signal according to the time difference output from the PDC 62 and the input reference signal. A digital word corresponding to this determined input signal phase is generated and output by the comparator 64. The digital word output by the detection circuit 50 corresponds to the source signal provided to the dividing circuit 20.

Referring again to FIG. 2, where the first signal is a sine-wave signal, and the second signal is a cosine-wave signal, the hard-limiting circuits 30 and 40 output a hard-limited sine-wave signal and a hard-limited cosine-wave signal, respectively. Since each of the sine-wave signal and the cosine-wave signal input into the detection circuit 50 have the same waveform, just shifted by 90 degrees relative to each other, the detection circuit 50 differentiates each 90 degree phase-shift of the underlying signal. By utilizing both the first signal and the second signal output from the dividing circuit 20, the overall SNR of the digital conversion circuit 2 is improved compared to the conventional digital conversion circuit that utilizes only a single signal output from the dividing circuit.

Figure 3:
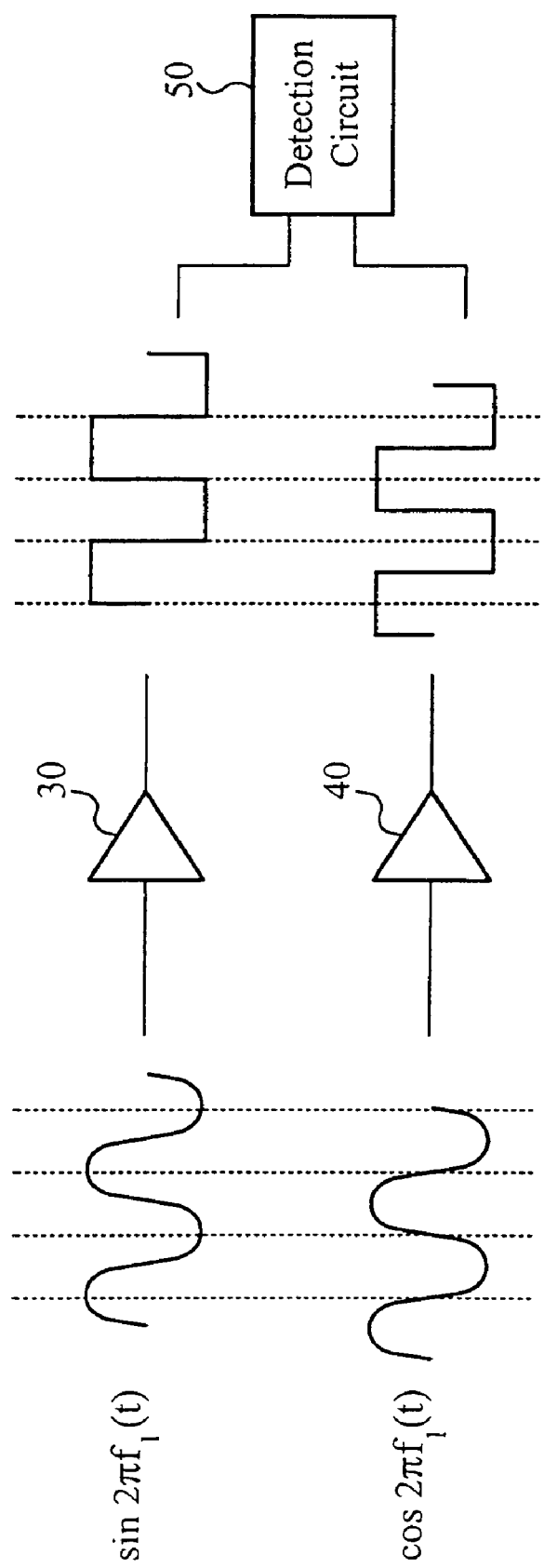
FIG. 3 illustrates exemplary waveforms of the signals input to the hard-limiting circuits and the detection circuit of FIG. 2.

FIG. 3 illustrates exemplary waveforms of the signals input to the hard-limiting circuits and the detection circuit of FIG. 2. In this exemplary case, the source signal has a sine-waveform represented by $\sin 2\pi f_1(t)$, where $f_1$ is the frequency of the first signal. The frequency $f_1$ is one-half the frequency of the source signal. The second signal has a cosine-waveform represented by $\cos 2\pi f_1(t)$. The hard-limiting circuit 30 is configured to saturate the first signal, thereby generating the hard-limited first signal. An exemplary hard-limited first signal, as shown in FIG. 3, has a square-waveform. The hard-limiting circuit 40 is configured to saturate the second signal, thereby generating the hard-limited second signal. An exemplary hard-limited second signal, as shown in FIG. 3, also has a square-waveform. In this case, the second signal is 90 degrees phase-shifted relative to the first signal, and correspondingly, the hard-limited second signal is phase-shifted 90 degrees relative to the hard-limited second signal. The detection circuit 50 generates the digital word corresponding to the source signal by, in part, either counting the rising and falling edges of each of the two input square waves or measuring the time difference between the two input square waves and comparing the results to the reference signal.

Under optimal conditions for a pure sine-wave signal source, a digital conversion circuit outputs a fixed, non-time varying digital value in response to an input source signal. Plotted on a digital output versus time graph, the digital output of a digital conversion circuit operating under ideal conditions is a straight horizontal line.

Figure 4:
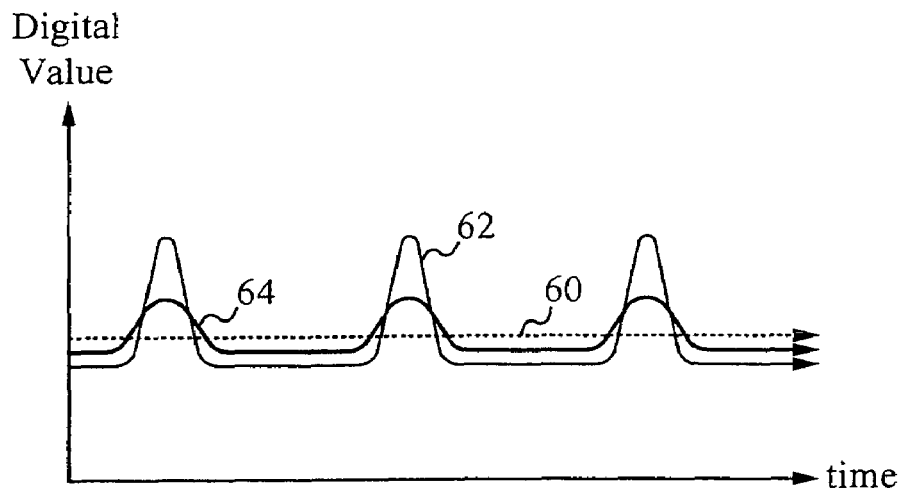
FIG. 4 illustrates a digital output versus time graph for an exemplary conventional digital conversion circuit.

FIG. 4 illustrates a digital output versus time graph for an exemplary digital conversion circuit. The x-axis measures time and the y-axis measures the digital output. Under optimal conditions, the digital conversion circuit outputs a straight line 60. However, under actual conditions, conventional digital conversion circuits are restricted by finite computing power. Due also to the sigma-delta structure included in most conventional digital conversion circuits, the resulting output digital values include periodic spikes, as exemplified by the curve 62 in FIG. 4. The long term average of the actual digital output is shown as curve 64. The digital conversion circuit is configured such that the long term average of the actual curve approximates the shape of the ideal curve as much as possible.

The system and method of the present invention enables a digital conversion circuit to generate more consistent digital outputs. The long term average of the digital output is smoother, and better approximates the ideal curve.

Figure 5:
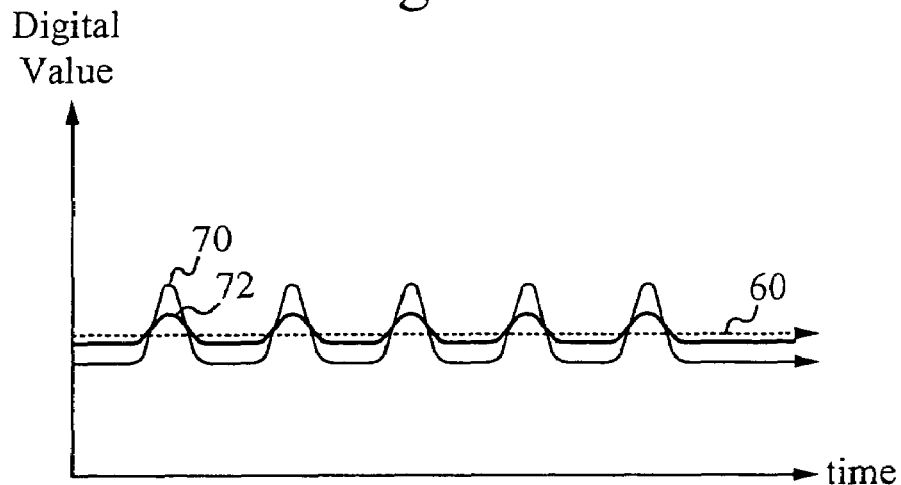
FIG. 5 illustrates a digital output versus time graph for an exemplary digital output of the detection circuit 50.

FIG. 5 illustrates a digital output versus time graph for an exemplary digital output of the digital conversion circuit of FIG. 2. The digital output of the digital conversion circuit is shown as curve 70. The long term average of the digital output is shown as curve 72. As compared to the conventional digital output curve 62 in FIG. 4, the digital output curve 72 includes more spikes, but the magnitude of each spike is lower. Such an output results in a smoother long term average curve 72, which better approximates the ideal digital output curve 60. A smoother long term average curve indicates less noise in the digital output signal.

Figure 6:
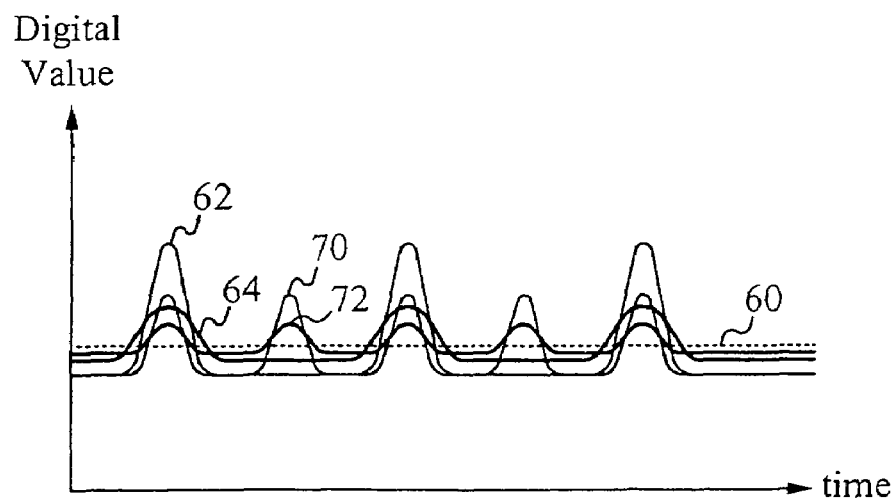
FIG. 6 illustrates the digital output versus time graph of FIG. 4 compared to the exemplary digital output of the detection circuit 50 as shown in FIG. 5.

FIG. 6 illustrates the digital output versus time graph of FIG. 4 compared to the exemplary digital output of the digital conversion circuit as shown in FIG. 5. Similar results are observed when applied to a phase-to-digital converter, such as the PDC 62 in FIG. 9.

Figure 7:
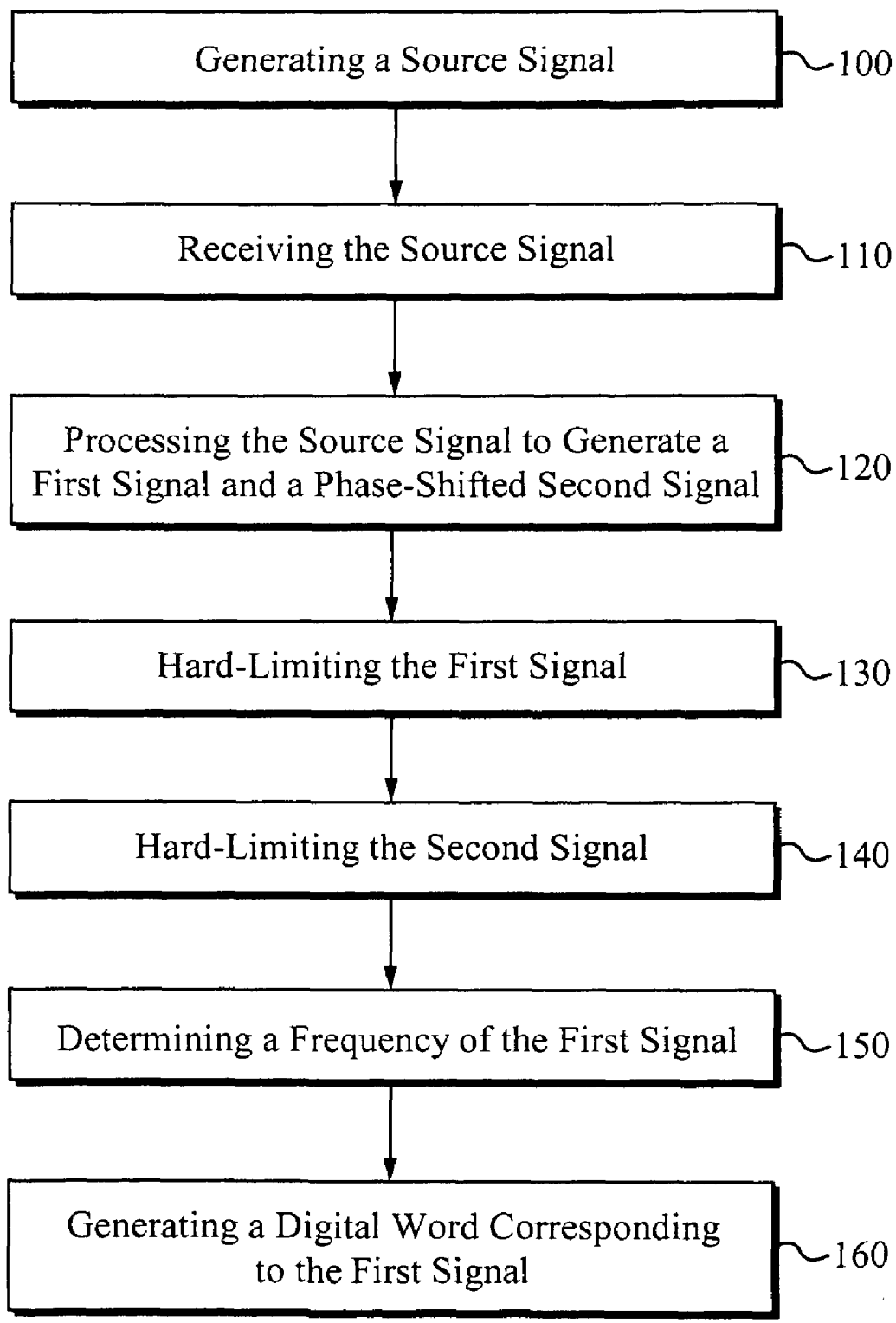
FIG. 7 illustrates an exemplary method of performing frequency-to-digital conversion.

FIG. 7 illustrates an exemplary method of performing frequency-to-digital conversion. At the step 100, a source signal is generated. In some embodiments, the source signal is generated by an oscillator. At the step 110, the source signal is received by a dividing circuit. In this exemplary method, the dividing circuit is a divide by 2 circuit. At the step 120, the source signal is processed to generate a divided down first signal and a second signal phase-shifted relative to the first signal. The first signal and the second signal have the same waveform, merely phase-shifted relative to each other. In some embodiments, the first signal has a sine-waveform, and the second signal has a cosine-waveform. In some embodiments, the second signal is phase-shifted 90 degrees relative to the first signal. At the step 130, the first signal is hard-limited to form a hard-limited first signal. At the step 140, the second signal is hard-limited to form a hard-limited analog signal. Where the first signal has a sine-waveform and the second signal has a cosine-waveform, the hard-limited first signal has a hard-limited sine-waveform and the hard-limited second signal has a hard-limited cosine-waveform. In some embodiments, each of the first signal and the second signal are hard-limited by a buffer amplifier.

At the step 150, a frequency of the first signal is determined. In some embodiments, the frequency is determined by measuring a number of rising and falling edges for the hard-limited first signal and a number of rising and falling edges for the hard-limited second signal. These two numbers are added together to determine a cumulative number of falling and rising edges for both the hard-limited first signal and the hard-limited second signal. The frequency of the input signal is calculated according to the cumulative number of rising and falling edges and an input reference signal, where the input reference signal includes a reference frequency and a corresponding reference number of rising and falling edges. Where the first signal and the second signal are 90 degrees phase-shifted, the step of measuring the number of rising and falling edges includes measuring each 90 degree phase-shift. At the step 160, a digital word is generated according to the source signal and the frequency determined at the step 150.

The system and method described above are configured such that the dividing circuit precedes the detection circuit. In alternative embodiments, the detection circuit precedes the dividing circuit. In such an alternative embodiment, the signal provided to the detection circuit is the source signal and includes N times the number of level changes, or zero-crossings, compared to the output of the dividing circuit.

Figure 10:
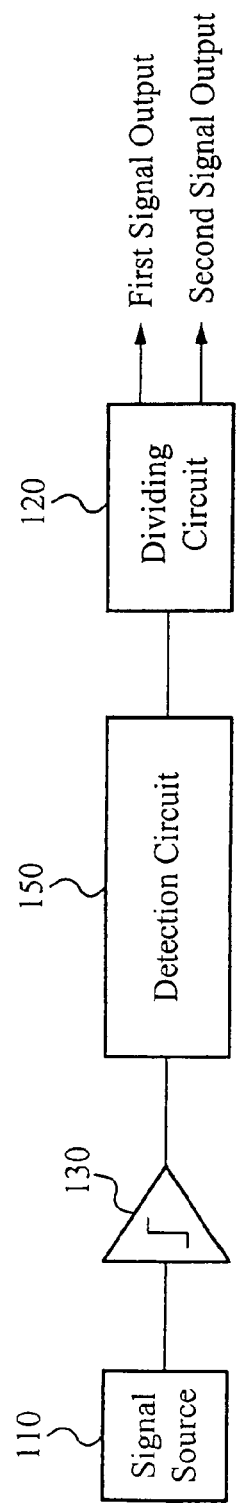
FIG. 10 illustrates another exemplary digital conversion circuit for providing digital conversion of a signal.

FIG. 10 illustrates another exemplary digital conversion circuit for providing digital conversion of a signal. The digital conversion circuit includes a signal source 110, a hard-limiting circuit 130, a detection circuit 150, and a dividing circuit 120. In some embodiments, the signal source 110 is an oscillator. In this exemplary configuration, the dividing circuit 120 is a divide by 2 circuit. The signal source 110 outputs a source signal to the hard-limiting circuit 130. The source signal includes two times the number of zero-crossings as the two signals output from the divide by two circuit 120. The hard-limiting circuit 130 outputs a hard-limited source signal, which is input to the detection circuit 150. The detection circuit 150 functions similarly to the detection circuit 50 in FIG. 2. The output of the detection circuit 150 is output to the dividing circuit 120.

The systems and methods described above are directed to open-loop configurations. Alternatively, the systems and methods are configured as closed-loop configurations.

Figure 11:
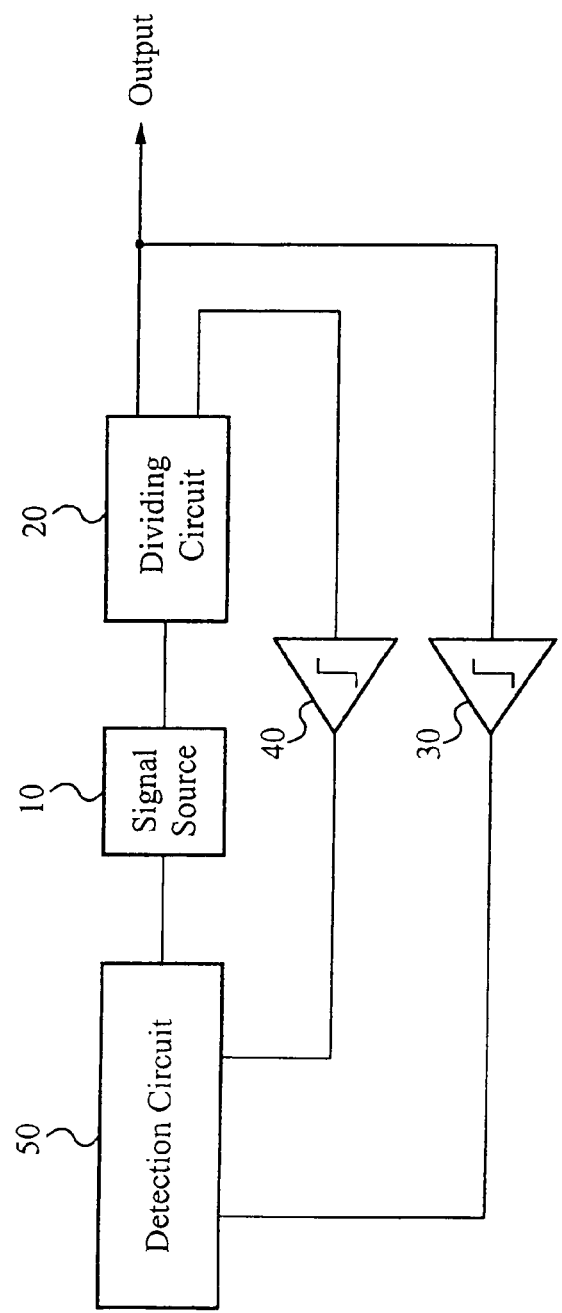
FIG. 11 illustrates an exemplary digital conversion circuit configured as a closed-loop.

FIG. 11 illustrates an exemplary digital conversion circuit configured as a closed-loop. In this first closed-loop configuration, the first signal output from the dividing circuit 20 is provided as feedback to the detection circuit 50, via the hard-limiting circuit 30. The second signal output from the dividing circuit 20 is provided as feedback to the detection circuit 50, via the hard-limiting circuit 40. The first signal output from the dividing circuit 20 is also provided as an output signal of the digital conversion circuit.

The first signal and the second signal together include all of the information included in the original source signal provided by the signal source 10. Since both the first signal and the second signal are provided as feedback to the detection circuit 50, the output signal of the digital conversion circuit does not suffer from a decreased SNR during the dividing down process performed by the dividing circuit 20.

Figure 12:
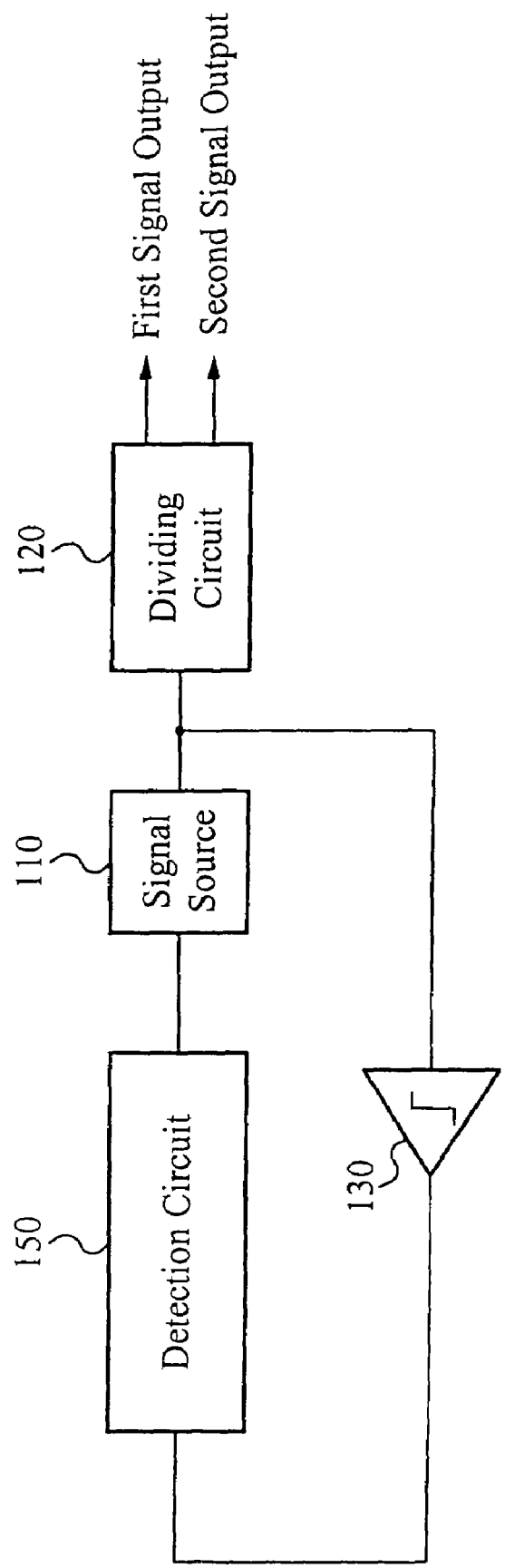
FIG. 12 illustrates another exemplary digital conversion circuit configured as a closed-loop.

FIG. 12 illustrates another exemplary digital conversion circuit configured as a closed-loop. The signal source 116, the dividing circuit 120, the hard-limiting circuit 130, and the detection circuit 150 each functions similarly to the signal source 10, the dividing circuit 20, the hard-limiting circuit 30, and the detection circuit 50, respectively, of FIGS. 2 and 11. In this second closed-loop configuration of FIG. 12, the source signal generated by the signal source 110 is provided as feedback to the detection circuit 150, via the hard-limiting circuit 130. The first signal output from the dividing circuit 120 is provided as an output signal of the digital conversion circuit. Similarly to the first closed-loop digital conversion circuit of FIG. 11, the output signal of the second closed-loop digital conversion circuit of FIG. 12 does not suffer from a decreased SNR during the dividing down process performed by the dividing circuit 120.

In the closed-loop configurations, either a phase-locked loop or a frequency-locked loop is formed. The locked loop is formed either by feeding back the source signal to the detection circuit, as in the second closed-loop configuration of FIG. 12, or by feeding back and parallel processing each divided down signal output from the dividing circuit, as in the first closed-loop configuration of FIG. 11. In both closed-loop configurations, all of the information included in the source signal is provided as feedback to lock the loop, thereby maintaining the SNR of the digital conversion circuit.

In general, each of the circuits and methods described above can be applied to the general condition where N is 1 or greater, where the dividing circuit is a divide by N circuit.

Figure 13:
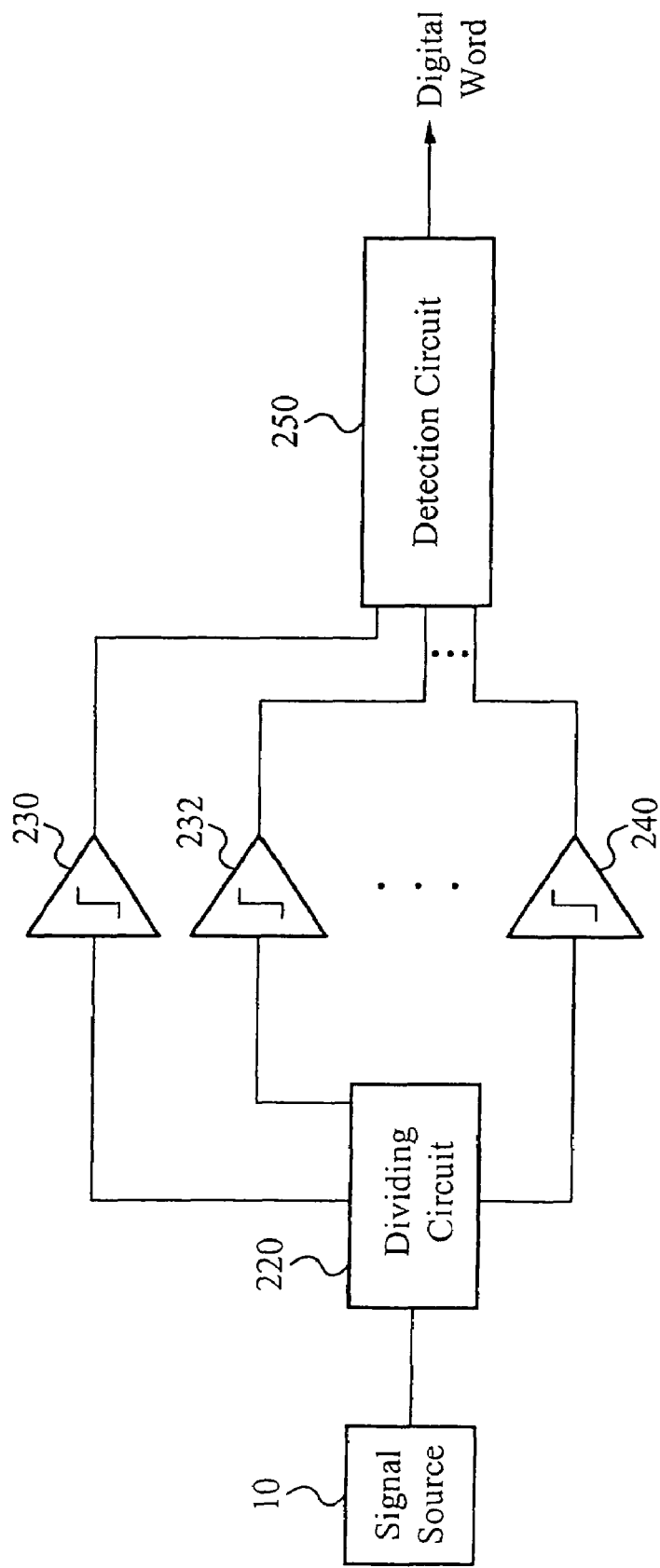
FIG. 13 illustrates a generalized version of the digital conversion circuit of FIG. 2.

FIG. 13 illustrates the digital conversion circuit of FIG. 2 generalized to include a dividing circuit 220 that is a divide by N circuit. Each of the N signals output from the dividing circuit 220 is input to one of N hard-limiting circuits 230, 232, 240. Each of the N hard-limiting circuits 230, 232, 240 output a hard-limited signal, collectively referred to as N hard-limited signals. The N hard-limited signals are input to the detection circuit 250.

Each of the alternative systems shown in FIGS. 10-12 can be similarly configured according to the general condition where N is 1 or greater, where the dividing circuit is a divide by N circuit.

The digital conversion circuit of the present invention maintains a better signal-to-noise ratio of a divided down output signal. With a better signal-to-noise ratio, a polar system utilizing the improved digital converter is able to be applied to higher data-rate modulations.

The present invention has been described in terms of specific embodiments incorporating details to facilitate the understanding of the principles of construction and operation of the power amplification circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

I claim:

1. An apparatus comprising:
    a. a dividing circuit configured to receive a source signal and to output N signals phase-shifted relative to each other, wherein a frequency of each of the N signals is a fraction of a frequency of the source signal;
    b. a plurality of hard-limiting circuits coupled to the dividing circuit, each hard-limiting circuit configured to receive one of the N signals output from the dividing circuit and to output a corresponding hard-limited signal; and
    c. a detection circuit coupled to the plurality of hard-limiting circuits, the detection circuit configured to receive each of the hard-limited signals and to output a digital word according the hard-limited signals.

2. The apparatus of claim 1 wherein the dividing circuit comprises a divide by N circuit.

3. The apparatus of claim 1 wherein each signal output from the dividing circuit comprises a same signal waveform.

4. The apparatus of claim 1 wherein the detection circuit comprises a frequency detection circuit.

5. The apparatus of claim 4 wherein the frequency detection circuit is configured to output the digital word according to a number of rising and falling edges for all of the hard-limited signals.

6. The apparatus of claim 1 wherein the detection circuit comprises a phase detection circuit.

7. The apparatus of claim 6 wherein the phase detection circuit is configured to output the digital word according to a time difference between rising edges of successive hard-limited signals.

8. The apparatus of claim 6 wherein the phase detection circuit is configured to output the digital word according to a time difference between falling edges of successive hard-limited signals.

9. The apparatus of claim 1 wherein each signal comprises a sine-wave, further wherein each hard-limited signal comprises a hard-limited sine-wave.

10. The apparatus of claim 1 wherein each of the plurality of hard-limiting circuits comprises a buffer amplifier.

11. A method of processing signals, the method comprising:
    a. receiving a source signal;
    b. dividing the source signal to generate N signals phase-shifted relative to each other, wherein a frequency of each of the N signals is a fraction of a frequency of the source signal;
    c. hard-limiting the N signals to generate N hard-limited signals; and
    d. converting the source signal to a corresponding digital word according to the N signals.

12. The method of claim 11 further comprising generating the source signal.

13. The method of claim 11 wherein converting the source signal comprises measuring a number of rising and falling edges for all of the N hard-limited signals.

14. The method of claim 11 wherein converting the source signal comprises measuring a time difference between rising edges of successive hard-limited signals.

15. The method of claim 11 wherein converting the source signal comprises measuring a time difference between falling edges of successive hard-limited signals.

16. The method of claim 11 wherein each of the N signals comprises a same signal waveform.

17. The method of claim 11 wherein each of the N signals comprises a sine-wave, further wherein each of the N hard-limited signals comprises a hard-limited sine-wave.

18. An apparatus comprising:
   a. a signal source configured to generate a source signal;
   b. a dividing circuit coupled to the signal source, wherein the dividing circuit is configured to receive the source signal and to output N signals phase-shifted relative to each other, further wherein a frequency of each of the N signals is a fraction of a frequency of the source signal;
   c. a plurality of hard-limiting circuits coupled to the dividing circuit, each hard-limiting circuit configured to receive one of the N signals output from the dividing circuit and to output a corresponding hard-limited signal; and
   d. a detection circuit coupled to the plurality of hard-limiting circuits, the detection circuit configured to receive each of the hard-limited signals and to output a digital word according to the hard-limited signals, wherein an output of the detection circuit is coupled to an input of the signal source,
   wherein the signal source is configured to generate the source signal according to the digital word received from the detection circuit, thereby forming a locked loop.

19. The apparatus of claim 18 wherein one of the N signals is in-phase with the source signal, and the apparatus is configured to output the one in-phase signal as a divided down output signal.

20. The apparatus of claim 18 wherein the dividing circuit is configured to determine the fraction.

21. The apparatus of claim 18 wherein the signal source comprises an oscillator.

22. The apparatus of claim 18 wherein the dividing circuit comprises a divide by N circuit.

23. The apparatus of claim 18 wherein each signal output from the dividing circuit comprises a same signal waveform.

24. The apparatus of claim 18 wherein the detection circuit comprises a frequency detection circuit.

25. The apparatus of claim 24 wherein the frequency detection circuit is configured to output the digital word according to a number of rising and falling edges for all of the hard-limited signals.

26. The apparatus of claim 18 wherein the detection circuit comprises a phase detection circuit.

27. The apparatus of claim 26 wherein the phase detection circuit is configured to output the digital word according to a time difference between rising edges of successive hard-limited signals.

28. The apparatus of claim 26 wherein the phase detection circuit is configured to output the digital word according to a time difference between falling edges of successive hard-limited signals.

29. The apparatus of claim 18 wherein each signal comprises a sine-wave, further wherein each hard-limited signal comprises a hard-limited sine-wave.

30. The apparatus of claim 18 wherein each of the plurality of hard-limiting circuits comprises a buffer amplifier.

31. An apparatus comprising:
   a. a signal source configured to generate a source signal;
   b. a dividing circuit coupled to the signal source, wherein the dividing circuit is configured to receive the source signal and to output at least one divided down signal with a frequency that is a fraction of a frequency of the source signal;
   c. a hard-limiting circuit coupled to the signal source, wherein the hard-limiting circuit is configured to receive the source signal and to output a corresponding hard-limited signal; and
   d. a detection circuit coupled to the hard-limiting circuit, wherein the detection circuit is configured to receive the hard-limited signal and to output a digital word according to the hard-limited signal, wherein an output of the detection circuit is coupled to an input of the signal source,
   wherein the signal source is configured to generate the source signal according to the digital word received from the detection circuit, thereby forming a locked loop.

32. The apparatus of claim 31 wherein one of the at least one signals output from the dividing circuit is in-phase with the source signal, and the apparatus is configured to output the one in-phase signal as a divided down output signal.

33. The apparatus of claim 31 wherein the dividing circuit is configured to determine the fraction.

34. The apparatus of claim 31 wherein the signal source comprises an oscillator.

35. The apparatus of claim 31 wherein the dividing circuit comprises a divide by N circuit.

36. The apparatus of claim 31 wherein each signal output from the dividing circuit comprises a same signal waveform.

37. The apparatus of claim 31 wherein the detection circuit comprises a frequency detection circuit.

38. The apparatus of claim 37 wherein the frequency detection circuit is configured to output the digital word according to a number of rising and falling edges for all of the hard-limited signals.

39. The apparatus of claim 31 wherein the detection circuit comprises a phase detection circuit.

40. The apparatus of claim 39 wherein the phase detection circuit is configured to output the digital word according to a time difference between rising edges of successive hard-limited signals.

41. The apparatus of claim 39 wherein the phase detection circuit is configured to output the digital word according to a time difference between falling edges of successive hard-limited signals.

42. The apparatus of claim 31 wherein each hard-limited signal comprises a hard-limited sine-wave.

43. The apparatus of claim 31 wherein each of the plurality of hard-limiting circuits comprises a buffer amplifier.

\* \* \* \* \*